United States Patent
Hassan et al.

(10) Patent No.: US 9,045,363 B2
(45) Date of Patent: Jun. 2, 2015

(54) LOW-E PANELS WITH TERNARY METAL OXIDE DIELECTRIC LAYER AND METHOD FOR FORMING THE SAME

(75) Inventors: Mohd Fadzli Anwar Hassan, San Francisco, CA (US); Richard Blacker, Farmington Hills, MI (US); Guowen Ding, San Jose, CA (US); Jingyu Lao, Saline, MI (US); Hien Minh Huu Le, San Jose, CA (US); Yiwei Lu, Ann Harbor, MI (US); Minh Anh Nguyen, San Jose, CA (US); Zhi-Wen Sun, Sunnyvale, CA (US)

(73) Assignees: Intermolecular, Inc., San Jose, CA (US); Guardian Industries Corp., Auburn Hills, MI (US)

(*) Notice: Subject to any disclaimer, the term of this patent is extended or adjusted under 35 U.S.C. 154(b) by 427 days.

(21) Appl. No.: 13/338,018

(22) Filed: Dec. 27, 2011

(65) Prior Publication Data
US 2013/0164561 A1 Jun. 27, 2013

(51) Int. Cl.
*C03C 17/23* (2006.01)
*C03C 17/34* (2006.01)
*C03C 17/36* (2006.01)

(52) U.S. Cl.
CPC .............. *C03C 17/36* (2013.01); *C03C 2217/21* (2013.01); *C03C 2217/281* (2013.01); *C03C 2217/26* (2013.01); *C03C 2217/228* (2013.01); *C03C 2217/23* (2013.01); *C03C 17/3618* (2013.01); *C03C 17/3644* (2013.01); *C03C 17/366* (2013.01)

(58) Field of Classification Search
None
See application file for complete search history.

(56) References Cited

U.S. PATENT DOCUMENTS

| | | | |
|---|---|---|---|
| 5,413,864 A * | 5/1995 | Miyazaki et al. | 428/432 |
| 5,591,529 A | 1/1997 | Braatz et al. | |
| 5,763,064 A * | 6/1998 | Suzuki et al. | 428/216 |
| 5,821,001 A | 10/1998 | Arbab et al. | |
| 5,955,179 A * | 9/1999 | Kickelhain et al. | 428/210 |
| 6,110,597 A * | 8/2000 | Fujisawa et al. | 428/432 |
| 6,451,434 B1 * | 9/2002 | Ebisawa et al. | 428/432 |
| 6,783,876 B2 * | 8/2004 | Schicht et al. | 428/697 |
| 6,797,389 B1 * | 9/2004 | Depauw | 428/432 |
| 6,899,953 B1 * | 5/2005 | O'Shaughnessy et al. | 428/432 |
| 2003/0186062 A1 * | 10/2003 | Ebisawa et al. | 428/426 |
| 2004/0005432 A1 | 1/2004 | Ridout | |
| 2005/0069717 A1 * | 3/2005 | Stachowiak | 428/432 |
| 2005/0238886 A1 | 10/2005 | Gallego | |
| 2006/0105180 A1 * | 5/2006 | Schicht et al. | 428/432 |
| 2006/0240266 A1 * | 10/2006 | Schicht et al. | 428/426 |
| 2007/0281171 A1 * | 12/2007 | Coster et al. | 428/432 |
| 2008/0014448 A1 | 1/2008 | Lu et al. | |
| 2008/0020211 A1 * | 1/2008 | Petrmichl et al. | 428/428 |
| 2009/0197077 A1 * | 8/2009 | Reutler et al. | 428/336 |
| 2010/0072884 A1 | 3/2010 | Tchakarov | |

FOREIGN PATENT DOCUMENTS

EP 304234 A2 * 2/1989
EP 2489756 A1 8/2012

* cited by examiner

*Primary Examiner* — David Sample

(57) ABSTRACT

Embodiments provided herein describe a low-e panel and a method for forming a low-e panel. A transparent substrate is provided. A metal oxide layer is formed over the transparent substrate. The metal oxide layer includes a first element, a second element, and a third element. A reflective layer is formed over the transparent substrate. The first element may include tin or zinc. The second element and the third element may each include tin, zinc, antimony, silicon, strontium, titanium, niobium, zirconium, magnesium, aluminum, yttrium, lanthanum, hafnium, or bismuth. The metal oxide layer may also include nitrogen.

11 Claims, 2 Drawing Sheets

LOW-E PANELS WITH TERNARY METAL OXIDE DIELECTRIC LAYER AND METHOD FOR FORMING THE SAME

The present invention relates to low-e panels. More particularly, this invention relates to low-e panels having a ternary metal oxide dielectric layer and a method for forming such low-e panels.

BACKGROUND OF THE INVENTION

Low emissivity, or low-e, panels (e.g., low-e glass panels) are often formed by depositing a reflective layer (e.g., silver), along with various other layers, onto a transparent substrate, such as glass. The various layers typically include dielectric layers, such as silicon nitride, tin oxide, and zinc oxide, to provide a barrier between the stack and both the glass and the environment.

Conventional low-e panels using such dielectric layers often form cracks along grain boundaries, especially in applications where the glass is bent or otherwise shaped. Additionally, conventional low-e panels often demonstrate significant changes in color during heat treatment (or tempering) after the layers (i.e., the stack) are formed on the glass. As such, the tempered panels appear to have a different color than those that have not been tempered.

BRIEF DESCRIPTION OF THE DRAWINGS

Various embodiments of the invention are disclosed in the following detailed description and the accompanying drawings.

DETAILED DESCRIPTION

Figure 1:
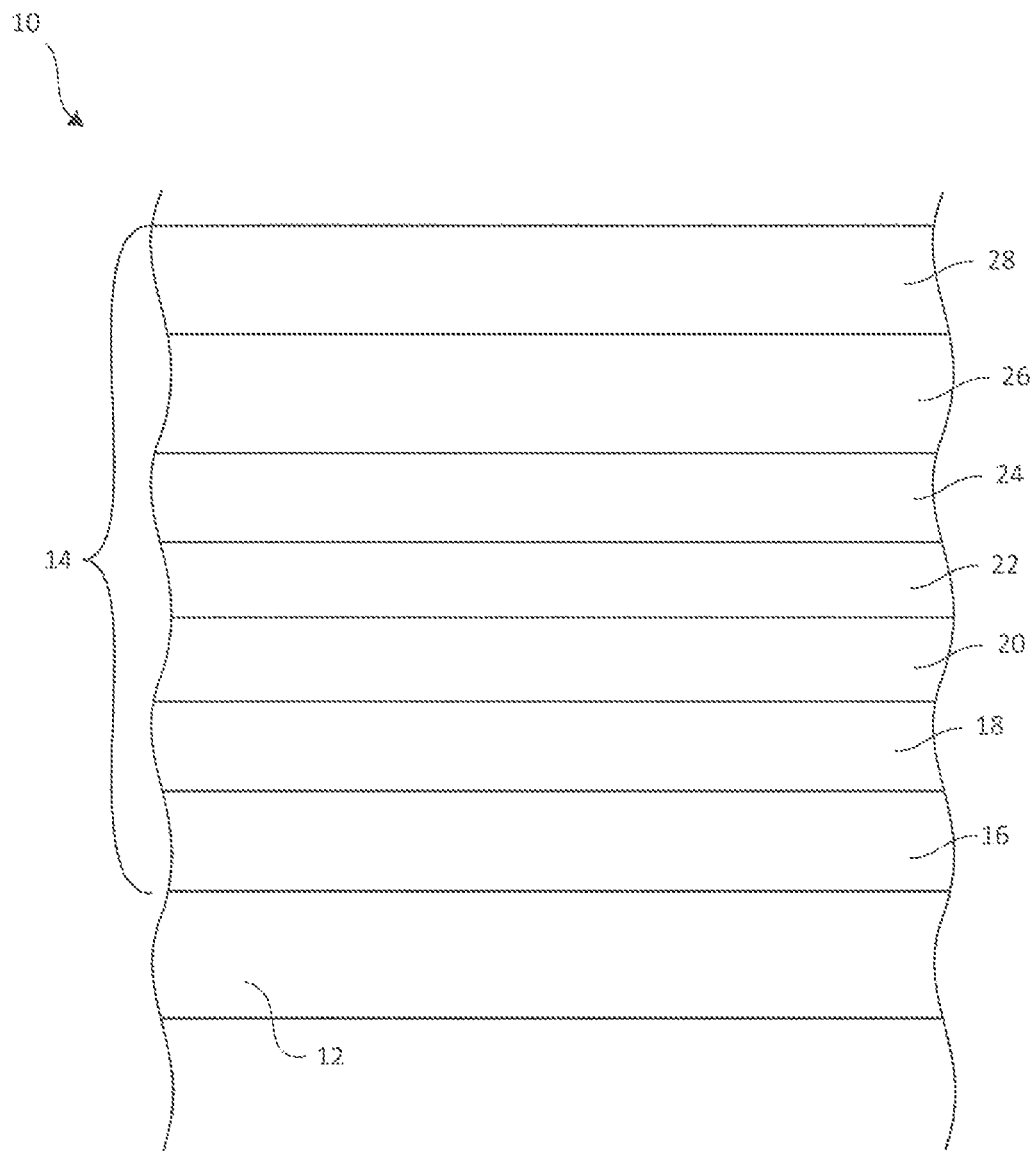
FIG. 1 is a cross-sectional side view of a low-e panel according to one embodiment of the present invention.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Embodiments described herein provide low-e panels with improved structural reliability and improved optical property stability. According to one aspect, a ternary metal oxide (or oxynitride) dielectric is used in the low-e stack. The ternary oxide is, for example, based on tin oxide or zinc oxide, and includes an additional two elements (i.e., for a total of three elements in addition to the oxygen and/or nitrogen). Examples of the additional elements include tin, zinc, antimony, silicon, strontium, titanium, niobium, zirconium, magnesium, aluminum, yttrium, lanthanum, hafnium, and bismuth. However, the three elements are unique (i.e., the metal is different than the two additional elements and the two additional elements are different from each other). Nitrogen gas may also be introduced during the formation of the dielectric such that the layer is a metal oxynitride.

The resulting dielectric layer forms an amorphous phase and demonstrates improved structural and optical stability after subsequent processes, such as heat treatments, compared to conventional tin oxide and zinc oxide dielectrics. The amorphous phase reduces grain boundaries that are susceptible to cracking in conventional low-e panels. As a result, low-e panels described herein may be bent and shaped without any cracking occurring along grain boundaries.

Additionally, the stability of the optical properties of the panels described herein is improved when compared to conventional panels. Specifically, changes in optical properties, such as refractive index (n) and extinction coefficient (k), caused by heat treatment are reduced, as are changes in overall color.

Further, the addition of nitrogen (i.e., the use of a ternary metal oxynitride), reduces the energy state of the material, thus providing a stable barrier against sodium diffusion, as well as moisture and air in the environment.

In one embodiment, a method for forming a low-e panel is provided. A transparent substrate is provided. A metal oxide layer is formed over the transparent substrate. The metal oxide layer includes oxygen, a first element, a second element, and a third element. A reflective layer is formed over the transparent substrate. The first element may include tin or zinc. The second element and the third element may each include tin, zinc, antimony, silicon, strontium, titanium, niobium, zirconium, magnesium, aluminum, yttrium, lanthanum, hafnium, or bismuth.

FIG. 1 illustrates a low-e panel 10 according to one embodiment of the present invention. The low-e panel 10 includes a transparent substrate 12 and a low-e stack 14 formed over the transparent substrate 12. The transparent substrate 12 in one embodiment is made of a low emissivity glass, such as borosilicate glass. However, in other embodiments, the transparent substrate 12 may be made of plastic or polycarbonate. The substrate 12 has a thickness of, for example, between 1 and 10 millimeters (mm). In a testing environment, the transparent substrate 12 may be round with a diameter of, for example, 200 or 300 mm. However, in a manufacturing environment, the substrate 12 may be square or rectangular and significantly larger (e.g., 0.5-6.0 meters (m) across).

The low-e stack 14 includes a lower dielectric layer 16, a lower metal oxide layer 18, a reflective layer 20, a metal alloy layer 22, an upper metal oxide layer 24, an upper dielectric layer 26, and a protective layer 28. Exemplary details as to the functionality provided by each of the layers 16-28 are provided below.

The various layers in the low-e stack 14 may be formed sequentially (i.e., from bottom to top) on the transparent substrate 12 using a physical vapor deposition (PVD) and/or reactive (or plasma enhanced) sputtering processing tool. In one embodiment, the low-e stack 14 is formed over the entire substrate 12. However, in other embodiments, the low-e stack 14 may only be formed on isolated portions of the substrate 12.

Still referring to FIG. 1, the lower dielectric layer 16 is formed on the upper surface of the transparent substrate 12. In one embodiment, the lower dielectric layer 16 is made of a ternary metal oxide or a ternary metal oxynitride. That is, the lower dielectric layer 16 may be made of a metal oxide or a metal oxynitride that includes three elements in additional to oxygen and/or nitrogen: a baseline metal and two additional elements.

The baseline metal, or first element, may be tin, zinc, or a combination thereof. In one embodiment, the first element accounts for between 15% and 92% by weight of the material of the lower dielectric layer 16.

The second element may be selected from a group that forms a compound with the baseline metal, such as tin, zinc, antimony, silicon, strontium, titanium, niobium, or zirconium, which may account for between 35% and 55% by weight of the material of the lower dielectric layer 16. Alternatively, the second element may be selected from a group of elements that form amorphous oxides when reactively sputtered with oxygen, such as magnesium, aluminum, yttrium, lanthanum, or hafnium, which may account for between 3% and 35% by weight of the material of the lower dielectric layer 16.

The third element may be selected from the same groups of elements from which the second element is chosen. However, bismuth may also be used. Thus, the third element may be selected from tin, zinc, antimony, silicon, strontium, titanium, niobium, zirconium, magnesium, aluminum, yttrium, lanthanum, hafnium, or bismuth. The third element may account for between 3% and 35% by weight of the material of the lower dielectric layer 16. The third element is preferably an element with a mid to high refractive index, such as titanium, antimony, bismuth, and niobium.

However, it should be understood that in at least some embodiments, three different or unique elements are used. That is, the first element is different than the second and third elements, and the second element is different than the third element. In one embodiment, the lower dielectric layer 16 is zinc-tin-titanium oxide.

It should be understood that the three elements may be deposited using various numbers of targets in, for example, a PVD tool, an example of which is described below. For example, each of the elements may be ejected from a separate target unique to (i.e., made of) that particular element. Alternatively, the elements may be deposited using alloy targets that include two, or more, of the elements, such as zinc, tin, and titanium. Further, the lower dielectric layer 16 may be made into the ternary oxynitride by, for example, using targets that include oxygen and nitrogen, or by introducing nitrogen into, for example, the PVD chamber, along with oxygen, when using a reactive sputtering technique.

As described above, the resulting lower dielectric layer 16 has, when compared to prior art dielectrics, a reduced number of grain boundaries and demonstrates improved optical stability.

The lower dielectric layer 16 has a thickness of, for example, 250 Angstroms (Å). The lower dielectric layer 16 may protect the other layers in the stack 14 from any elements which may otherwise diffuse from the substrate 12 and may be used to tune the optical properties (e.g., transmission) of the stack 14 and/or the low-e panel 10 as a whole. For example, the thickness and refractive index of the lower dielectric layer 16 may be used to increase or decrease visible light transmission.

The lower metal oxide layer 18 is formed over the substrate 12 and on the lower dielectric layer 16. In one embodiment, the lower metal oxide layer 18 is made of as zinc oxide and has a thickness of, for example, 100 Å. The lower metal oxide layer 18 may enhance the texturing of the reflective layer 20 and increase the transmission of the stack 14 for anti-reflection purposes. It should be understood that in other embodiments, the lower metal oxide layer 18 may be made of tin oxide or may not be included at all.

Referring again to FIG. 1, in the depicted embodiment, the reflective layer 20 is formed on the lower metal oxide layer 18. In one embodiment, the reflective layer 20 is made of silver and has a thickness of, for example, 100 Å.

Still referring to FIG. 1, the metal alloy layer 22 and the upper metal oxide layer 24 are formed over the reflective layer 20. In one embodiment, the metal alloy layer 24 is made of nickel-chromium and has a thickness of, for example, 30 Å. The metal alloy layer 22 may prevent the reflective layer 20 from oxidizing and protect the reflective layer 20 during subsequent processing steps, such as heating. The upper metal oxide layer 24 is formed on the metal alloy layer 24. In one embodiment, the upper metal oxide layer 24 includes the metal alloy of the metal alloy layer 22 (e.g., nickel-chromium oxide) and has a thickness of, for example, 30 Å. The upper metal oxide layer 24 may provide adhesion between the reflective layer 20 and the upper dielectric layer 26.

The upper dielectric layer 26 is formed on the upper metal oxide layer 24. In one embodiment, the upper dielectric layer 26 is made of the same material as the lower dielectric layer 16 (e.g., a ternary metal oxide or a ternary metal oxynitride). That is, the material of the upper dielectric layer 26 may include three elements (i.e. a fourth element, a fifth element, and a sixth element) that are the same as the three respective elements (i.e., the first element, the second element, and the third element) in the material of the lower dielectric layer 16. The lower dielectric layer may have the same thickness as the lower dielectric layer 16 and may be used for anti-reflection purposes, as well as a barrier against the environment.

Still referring to FIG. 1, the protective layer 28 is formed on the upper dielectric layer 26. In one embodiment, the protective layer 28 is made of silicon nitride and has a thickness of, for example, 250 Å. The protective layer 28 may be used to provide additional protection for the lower layers of the stack 14 and further adjust the optical properties of the stack 14. However, it should be understood that some embodiments may not include the protective layer 28. Additionally, although not shown in FIG. 1, some embodiments may also include a second protective layer (e.g., silicon nitride) between the glass substrate 12 and the lower dielectric layer 16.

It should be noted that depending on the exact materials used, some of the layers of the low-e stack 14 may have some materials in common. An example of such a stack may use a zinc-based material in the dielectric layers 16 and 26 and include a zinc oxide lower metal oxide layer 18. As a result, embodiments described herein may allow for a relatively low number of different targets to be used for the formation of the low-e stack 14. This is particularly true for embodiments that do not include the protective layer 28.

Thus, in some embodiments, a method for forming a low-e panel is provided. A transparent substrate is provided. A metal oxide layer is formed over the transparent substrate. The metal oxide layer includes oxygen, a first element, a second element, and a third element. The first element is different than the second element and the third element, and the second element is different than the third element. The first element includes tin or zinc. The second element and the third element each include tin, zinc, antimony, silicon, strontium, titanium, niobium, zirconium, magnesium, aluminum, yttrium, lanthanum, hafnium, or bismuth. A reflective layer is formed over the transparent substrate.

In another embodiment, a low-e panel is provided. The low-e panel includes a transparent substrate, a metal oxide layer formed over the transparent substrate, and a reflective layer formed over the metal oxide layer. The metal oxide layer includes oxygen, a first element, a second element, and a third element. The first element is different than the second element and the third element, and the second element is different than the third element. The first element includes tin or zinc. The second element and the third element each include tin, zinc, antimony, silicon, strontium, titanium, niobium, zirconium, magnesium, aluminum, yttrium, lanthanum, hafnium, or bismuth.

In a further embodiment, a method for forming a low-e panel is provided. A transparent substrate is provided. A metal oxynitride layer is formed over the transparent substrate. The metal oxynitride layer includes a first element, a second element, and a third element. The first element is different than the second element and the third element, and the second element is different than the third element. The first element includes tin or zinc. The second element includes tin, zinc, antimony, silicon, strontium, titanium, niobium, zirconium, magnesium, aluminum, yttrium, lanthanum, or hafnium. The third element includes titanium, antimony, bismuth, or niobium. A silver layer is formed over the transparent substrate.

Figure 2:
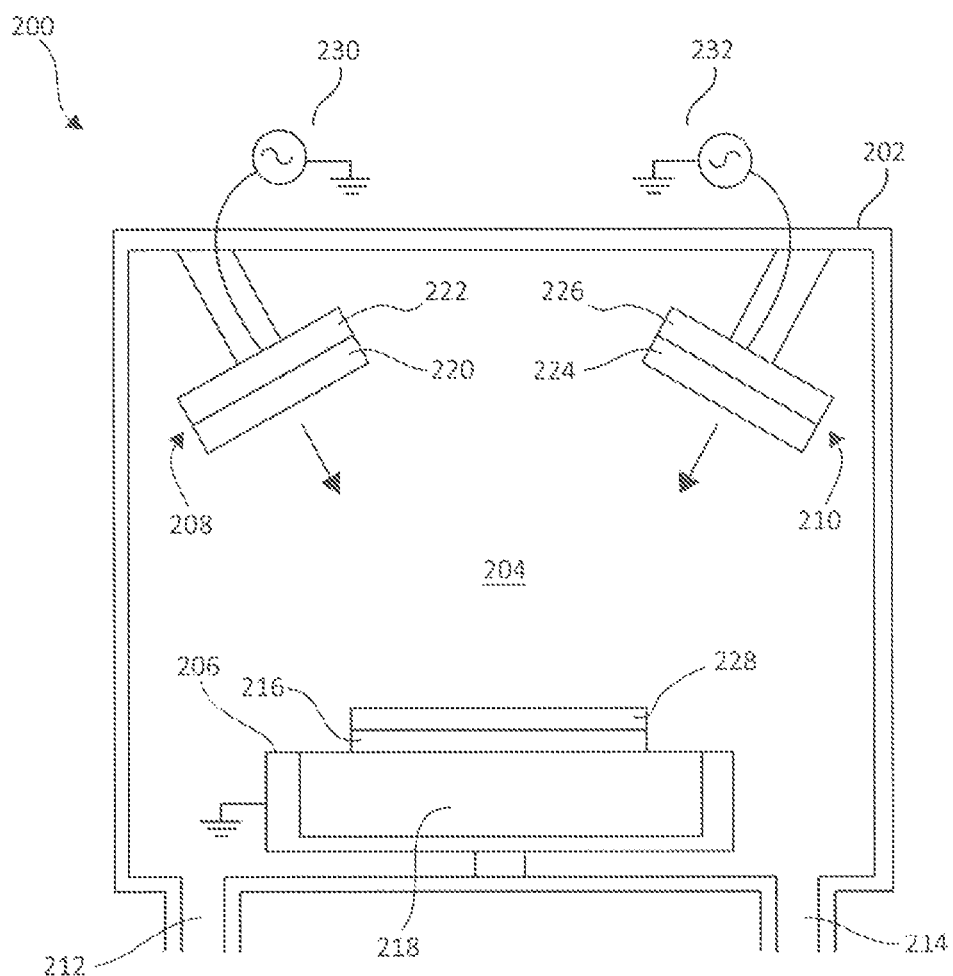
FIG. 2 is a simplified cross-sectional diagram illustrating a physical vapor deposition (PVD) tool according to one embodiment of the present invention.

FIG. 2 provides a simplified illustration of a physical vapor deposition (PVD) tool (and/or system) 200 which may be used to formed the low-e glass panel 10 and/or the low-e stack 14 described above, in accordance with one embodiment of the invention. The PVD tool 200 shown in FIG. 2 includes a housing 202 that defines, or encloses, a processing chamber 204, a substrate support 206, a first target assembly 208, and a second target assembly 210.

The housing 202 includes a gas inlet 212 and a gas outlet 214 near a lower region thereof on opposing sides of the substrate support 206. The substrate support 206 is positioned near the lower region of the housing 202 and in configured to support a substrate 216. The substrate 216 may be a round glass (e.g., borosilicate glass) substrate having a diameter of, for example, 200 mm or 300 mm. In other embodiments (such as in a manufacturing environment), the substrate 216 may have other shapes, such as square or rectangular, and may be significantly larger (e.g., 0.5-6 m across). The substrate support 206 includes a support electrode 218 and is held at ground potential during processing, as indicated.

The first and second target assemblies (or process heads) 208 and 210 are suspended from an upper region of the housing 202 within the processing chamber 204. The first target assembly 208 includes a first target 220 and a first target electrode 222, and the second target assembly 210 includes a second target 224 and a second target electrode 226. As shown, the first target 220 and the second target 224 are oriented or directed towards the substrate 216. As is commonly understood, the first target 220 and the second target 224 include one or more materials that are to be used to deposit a layer of material 228 on the upper surface of the substrate 216.

The materials used in the targets 220 and 224 may, for example, include tin, zinc, antimony, silicon, strontium, titanium, niobium, zirconium, magnesium, aluminum, yttrium, lanthanum, hafnium, bismuth, silicon, silver, nickel, chromium, or any combination thereof (i.e., a single target may be made of an alloy of several metals). Additionally, the materials used in the targets may include oxygen, nitrogen, or a combination of oxygen and nitrogen in order to form the oxides, nitrides, and oxynitrides described above. Additionally, although only two targets 220 and 224 are shown in the depicted embodiment, additional targets may be used. As such, different combinations of targets may be used to form, for example, the dielectric layers described above. For example, in an embodiment in which the dielectric material is zinc-tin-titanium oxide, the zinc, the tin, and the titanium may be provided by separate zinc, tin, and titanium targets, or they may be provided by a single zinc-tin-titanium alloy target.

The PVD tool 200 also includes a first power supply 230 coupled to the first target electrode 222 and a second power supply 232 coupled to the second target electrode 224. As is commonly understood, the power supplies 230 and 232 pulse direct current (DC) power to the respective electrodes, causing material to be, at least in some embodiments, simultaneously sputtered (i.e., co-sputtered) from the first and second targets 220 and 224.

During sputtering, inert gases, such as argon or kypton, may be introduced into the processing chamber 204 through the gas inlet 212, while a vacuum is applied to the gas outlet 214. However, in embodiments in which reactive sputtering is used, reactive gases may also be introduced, such as oxygen and/or nitrogen, which interact with particles ejected from the targets (i.e., to form oxides, nitrides, and/or oxynitrides).

Although not shown in FIG. 2, the PVD tool 200 may also include a control system having, for example, a processor and a memory, which is in operable communication with the other components shown in FIG. 2 and configured to control the operation thereof in order to perform the methods described herein.

Further, although the PVD tool 200 shown in FIG. 2 includes a stationary substrate support 206, it should be understood that in a manufacturing environment, the substrate 216 may be in motion during the various layers described herein.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A low-e panel comprising:
  a transparent substrate;
  a metal oxide layer formed over the transparent substrate, wherein the metal oxide layer comprises oxygen, a first element, a second element, and a third element, wherein the first element is tin or zinc, the second element is strontium, and the third element is hafnium; and
  a reflective layer formed over the transparent substrate.

2. The low-e panel of claim 1, wherein the metal oxide layer further comprises nitrogen, and the reflective layer is formed over the metal oxide layer.

3. The low-e panel of claim 2, further comprising a second metal oxide layer formed over the reflective layer, the second metal oxide layer comprising a fourth element, a fifth element, and a sixth element, wherein the fourth element is tin or zinc, the fifth element is strontium, and the sixth element is hafnium.

4. The low-e panel of claim 3, wherein the first element is the same as the fourth element, the second element is the same as the fifth element, and the third element is the same as the sixth element, and wherein the second the metal oxide layer further comprises nitrogen.

5. The low-e panel of claim 1, wherein the reflective layer comprises silver.

6. A low-e panel comprising:
  a transparent substrate;
  a first metal oxide layer formed over the transparent substrate, wherein the first metal oxide layer comprises oxygen, a first element, a second element, and a third element, wherein the first element is tin or zinc, the second element is strontium, and the third element is hafnium;
  a reflective layer formed over the first metal oxide layer; and a second metal oxide layer formed over the reflective layer, wherein the second metal oxide layer is made of the same material as the first metal oxide layer.

7. The low-e panel of claim 6, wherein the first metal oxide layer further comprises nitrogen.

8. The low-e panel of claim 7, wherein the reflective layer comprises silver.

9. A low-e panel comprising:
a transparent substrate;
a metal oxide layer formed over the transparent substrate, wherein the metal oxide layer consists of oxygen, a first element, a second element, and a third element, wherein the first element is different than the second element and the third element, and wherein the second element is different than the third element, and wherein
the first element is tin, and
the second element and the third element are each selected from the group consisting of strontium, magnesium, and hafnium; and
a reflective layer formed over the transparent substrate.

10. The low-e panel of claim 9, wherein the reflective layer is formed over the metal oxide layer.

11. The low-e panel of claim 10, further comprising a second metal oxide layer formed over the reflective layer, wherein the second metal oxide layer consists of oxygen, a fourth element, a fifth element, and a sixth element, wherein the fourth element is different than the fifth element and the sixth element, and wherein the fifth element is different than the sixth element, and wherein the fourth element is tin, and the fifth element and the sixth element are each selected from the group consisting of strontium, magnesium, and hafnium.

* * * * *